US012575172B2

(12) United States Patent
Hung et al.

(10) Patent No.: US 12,575,172 B2
(45) Date of Patent: Mar. 10, 2026

(54) METAL GATE ELECTRODE FORMATION OF MEMORY DEVICES

(71) Applicant: Taiwan Semiconductor Manufacturing Company, Ltd., Hsin-Chu (TW)

(72) Inventors: Jo-Chun Hung, Hsinchu City (TW); Chih-Wei Lee, Taipei City (TW); Wen-Hung Huang, Hsin-Chu (TW); Hui-Chi Chen, Hsinchu County (TW); Jian-Hao Chen, Hsinchu City (TW); Kuo-Feng Yu, Hsinchu County (TW); Hsin-Han Tsai, Hsinchu (TW); Yin-Chuan Chuang, Yunlin County (TW); Yu-Ling Cheng, Tainan City (TW); Yu-Xuan Wang, New Taipei City (TW); Tefu Yeh, Kaohsiung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 816 days.

(21) Appl. No.: 17/832,590

(22) Filed: Jun. 4, 2022

(65) Prior Publication Data
US 2023/0395598 A1 Dec. 7, 2023

(51) Int. Cl.
H10D 84/85 (2025.01)
H01L 21/02 (2006.01)
(Continued)

(52) U.S. Cl.
CPC ....... H10D 84/85 (2025.01); H01L 21/02603 (2013.01); H01L 21/28088 (2013.01);
(Continued)

(58) Field of Classification Search
CPC ......... H10D 30/014; H10D 30/43–435; H10D 30/6735; H10D 84/014; H10D 84/0177
See application file for complete search history.

(56) References Cited

U.S. PATENT DOCUMENTS 7,564,115 B2 7/2009 Chen et al.
7,633,165 B2 12/2009 Hsu et al.
(Continued)

FOREIGN PATENT DOCUMENTS

| CN | 111834445 A | 10/2020 |
| TW | 202027218 A | 7/2020 |
| TW | 202141688 A | 11/2021 |

*Primary Examiner* — Eric A. Ward
(74) *Attorney, Agent, or Firm* — Haynes and Boone, LLP

(57) ABSTRACT

A sacrificial layer is formed over a first channel structure of an N-type transistor (NFET) and over a second channel structure of a P-type transistor (PFET). A PFET patterning process is performed at least in part by etching away the sacrificial layer in the PFET while protecting the NFET from being etched. After the PFET patterning process has been performed, a P-type work function (WF) metal layer is deposited in both the NFET and the PFET. An NFET patterning process is performed at least in part by etching away the P-type WF metal layer and the sacrificial layer in the NFET while protecting the PFET from being etched. After the NFET patterning process has been performed, an N-type WF metal layer is deposited in both the NFET and the PFET.

20 Claims, 21 Drawing Sheets

(51) Int. Cl.

| | |
|---|---|
| *H01L 21/28* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2025.01) |
| *H10D 84/03* | (2025.01) |

(52) U.S. Cl.
CPC ......... *H10D 30/014* (2025.01); *H10D 30/031* (2025.01); *H10D 30/43* (2025.01); *H10D 30/6735* (2025.01); *H10D 30/6739* (2025.01); *H10D 30/6757* (2025.01); *H10D 62/121* (2025.01); *H10D 84/0167* (2025.01); *H10D 84/0177* (2025.01); *H10D 84/038* (2025.01)

(56) References Cited

U.S. PATENT DOCUMENTS

| | | | |
|---|---|---|---|
| 7,825,024 | B2 | 11/2010 | Lin et al. |
| 7,973,413 | B2 | 7/2011 | Kuo et al. |
| 8,105,875 | B1 | 1/2012 | Hu et al. |
| 8,158,456 | B2 | 4/2012 | Chen et al. |
| 8,183,578 | B2 | 5/2012 | Wang |
| 8,183,579 | B2 | 5/2012 | Wang |
| 8,227,902 | B2 | 7/2012 | Kuo |
| 8,278,152 | B2 | 10/2012 | Liu et al. |
| 8,426,961 | B2 | 4/2013 | Shih et al. |
| 8,669,174 | B2 | 3/2014 | Wu et al. |
| 8,802,504 | B1 | 8/2014 | Hou et al. |
| 8,803,292 | B2 | 8/2014 | Chen et al. |
| 8,803,316 | B2 | 8/2014 | Lin et al. |
| 9,548,318 | B1 | 1/2017 | Chi |
| 2014/0001645 | A1 | 1/2014 | Lin et al. |
| 2014/0225258 | A1 | 8/2014 | Chiu et al. |
| 2014/0252572 | A1 | 9/2014 | Hou et al. |
| 2015/0357244 | A1* | 12/2015 | Ragnarsson ......... H10D 84/014 438/275 |
| 2018/0342427 | A1* | 11/2018 | Xie ................... H01L 21/32139 |
| 2020/0043808 | A1* | 2/2020 | Bao ..................... H01L 21/3215 |
| 2020/0051872 | A1* | 2/2020 | Guo .................. H10D 84/0158 |
| 2020/0083326 | A1* | 3/2020 | Ok .......................... B82Y 10/00 |
| 2022/0093598 | A1* | 3/2022 | Lavric .................. H10D 84/038 |
| 2022/0173097 | A1* | 6/2022 | Yang ................... H10D 84/834 |
| 2022/0416039 | A1* | 12/2022 | Lavric ............... H10D 84/0177 |
| 2023/0029827 | A1* | 2/2023 | Park .................... H10D 64/017 |

* cited by examiner

200

PFET Patterning Process

340

320

B'

B

280

210

220

170

185

270

130

210

110

PFET

185

270

130

220

170

230

110

NFET

280

185

270

130

Z

Y

P-type WF Metal Pull-Back Process

200

B'

B 280
210
185
270
130

220
400
170

450
430

185
270
130

400
220
210
170
230
110
PFET 185
270
130
280

110
NFET

Y

Z

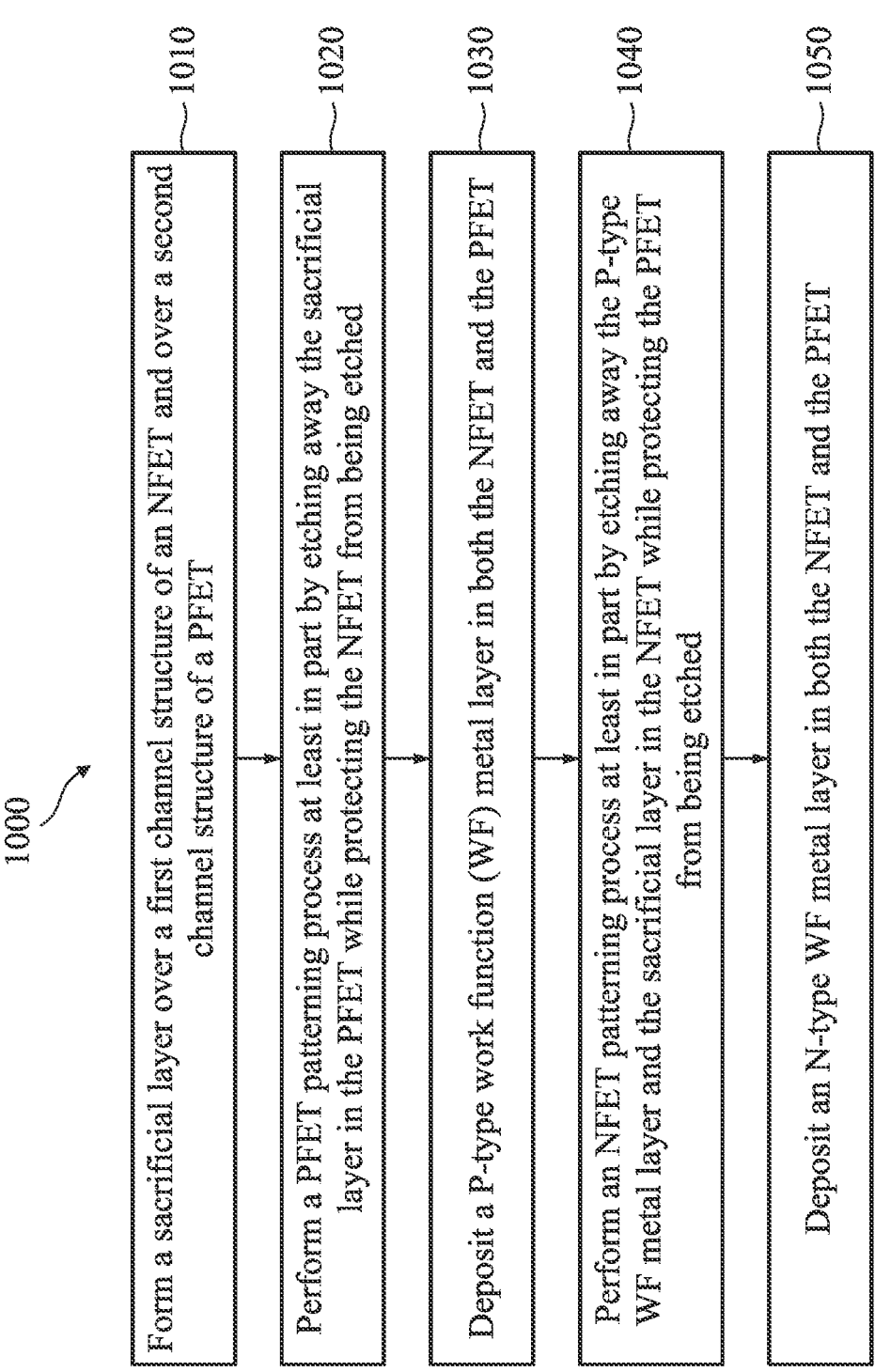

1000

1010 — Form a sacrificial layer over a first channel structure of an NFET and over a second channel structure of a PFET 1020 — Perform a PFET patterning process at least in part by etching away the sacrificial layer in the PFET while protecting the NFET from being etched 1030 — Deposit a P-type work function (WF) metal layer in both the NFET and the PFET 1040 — Perform an NFET patterning process at least in part by etching away the P-type WF metal layer and the sacrificial layer in the NFET while protecting the PFET from being etched 1050 — Deposit an N-type WF metal layer in both the NFET and the PFET

Fig. 12

METAL GATE ELECTRODE FORMATION OF MEMORY DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, existing IC fabrication processes may still have certain drawbacks. For example, existing IC fabrication methods may lead to unintentional and undesirable oxidation of a work function (WF) metal, particularly for an NFET device. As a result of such an undesirable oxidation, device performance (e.g., in terms of speed or threshold voltage consistency) may be degraded.

Therefore, although existing semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 2A-9A and 2B-9B illustrate a series of cross-sectional views of a semiconductor device at various stages of fabrication according to embodiments of the present disclosure.

FIG. 12 is a flowchart illustrating a method of fabricating a semiconductor device according to various aspects of the present disclosure.

DETAILED DESCRIPTION

Figures 1A, 1B:
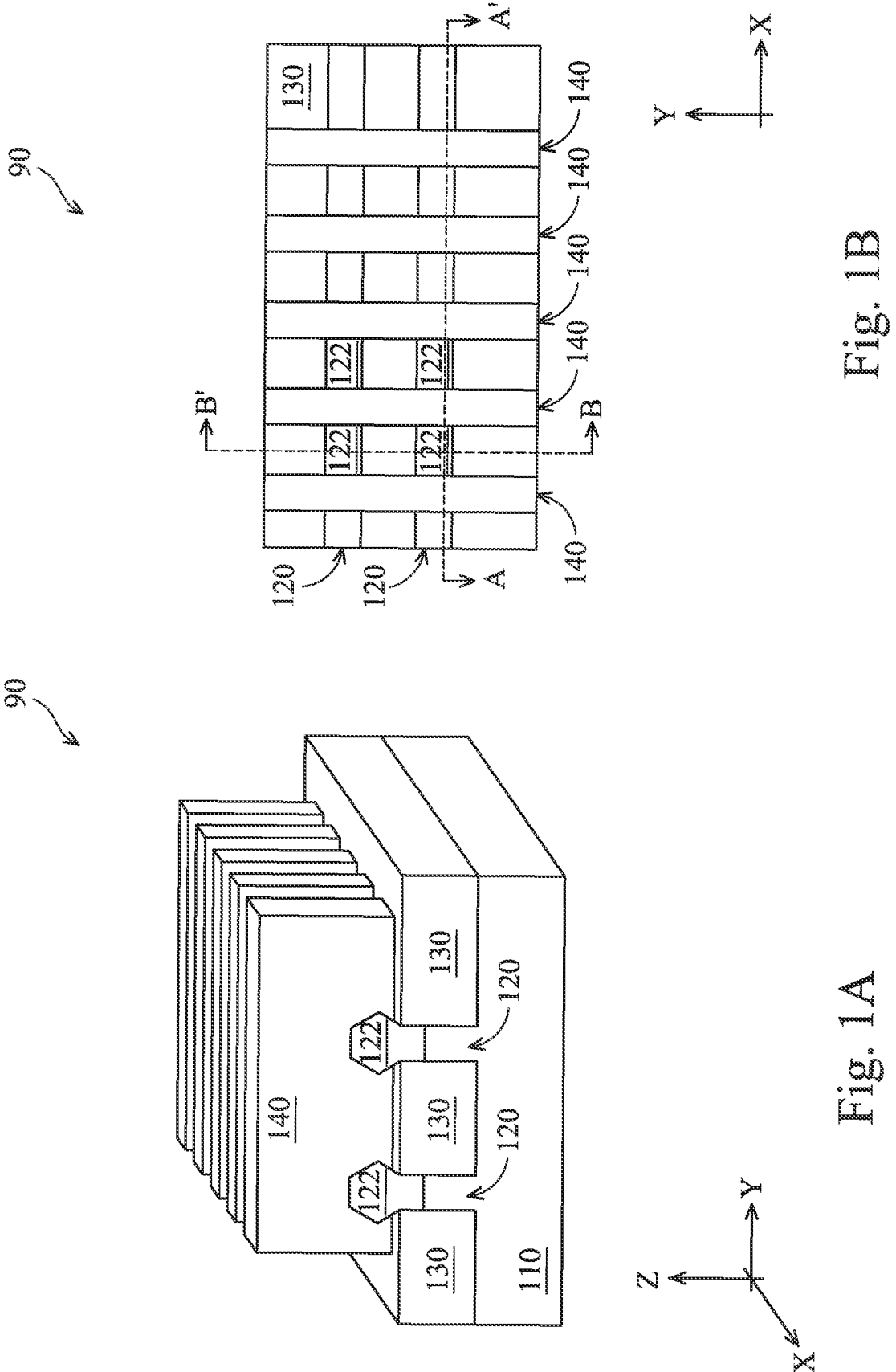
FIG. 1A illustrates a three-dimensional perspective view of a FinFET device.
FIG. 1B illustrates a top view of a FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, which may be fabricated using field-effect transistors (FETs) such as three-dimensional fin-line FETs (FinFETs) or multi-channel gate-all-around (GAA) devices. FinFET devices have semiconductor fin structures that protrude vertically out of a substrate. The fin structures are active regions, from which source/drain regions and/or channel regions are formed. The gate structures partially wrap around the fin structures. GAA devices have multiple elongated nano-structure channels that may be implemented as nano-tubes, nano-sheets, or nanowires. In recent years, FinFET devices and GAA devices have gained popularity due to their enhanced performance compared to conventional planar transistors.

However, as semiconductor device sizes continue to get scaled down, conventional methods of fabricating FinFETs or GAA devices may face various challenges. For example, conventional methods of fabricating FinFET or GAA devices form the metal gate electrodes for N-type transistors (NFETs) before P-type transistors (PFETs). This type of fabrication process flow may lead to unintentional and undesirable oxidation of the N-type work function (WF) metal (e.g., TiAlC) of the NFETs, which may occur as photoresist materials are removed. The oxidation of the N-type work function metal of NFETs may lead to performance degradations, such as slow device speed or excessive threshold voltage (Vt) variation. This problem is exacerbated for certain IC applications where NFET performance may be more important than PFET performance, such as Static Random Access Memory (SRAM) devices.

To address the problem discussed above, the present disclosure implements a unique fabrication process flow, in which the P-type WF metal of the PFETs are formed before the N-type WF metal of the NFETs. Such a process flow avoids exposing the N-type WF metals to the undesirable oxidation that occurs when photoresist materials are removed. In other words, the photoresist material removal (that could otherwise oxidize the N-type WF metal) occurs before the formation of the N-type WF metal, which means that the N-type WF metal herein is unlikely to experience the undesirable oxidation associated with conventional devices. As such, the present disclosure may simultaneously achieve improved device performance, for example, faster device speed or more uniformity for the threshold voltage, particularly for IC applications such as SRAMs.

Figure 1C:
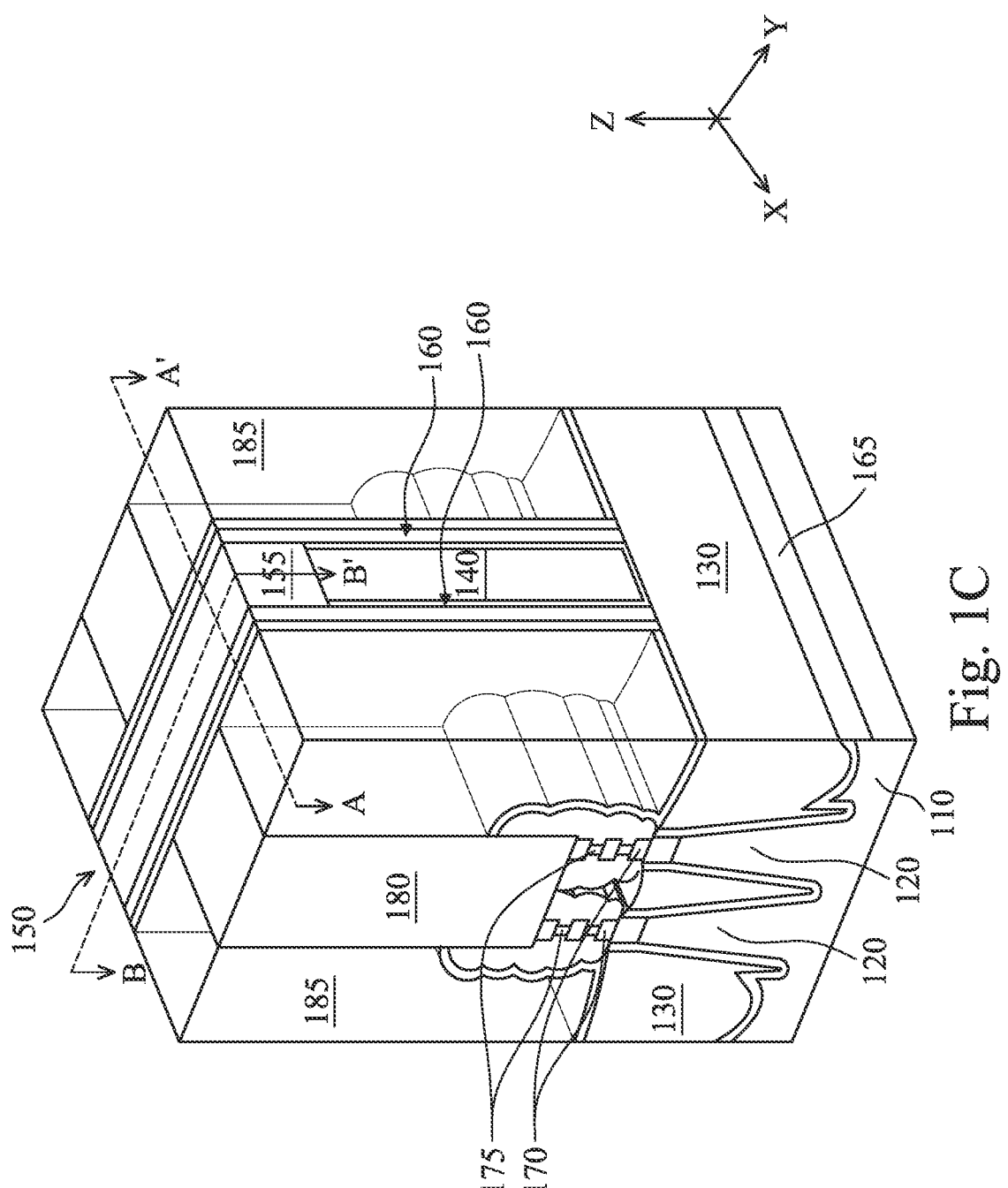
FIG. 1C illustrates a three-dimensional perspective view of a multi-channel gate-all-around (GAA) device.
Figure 10:
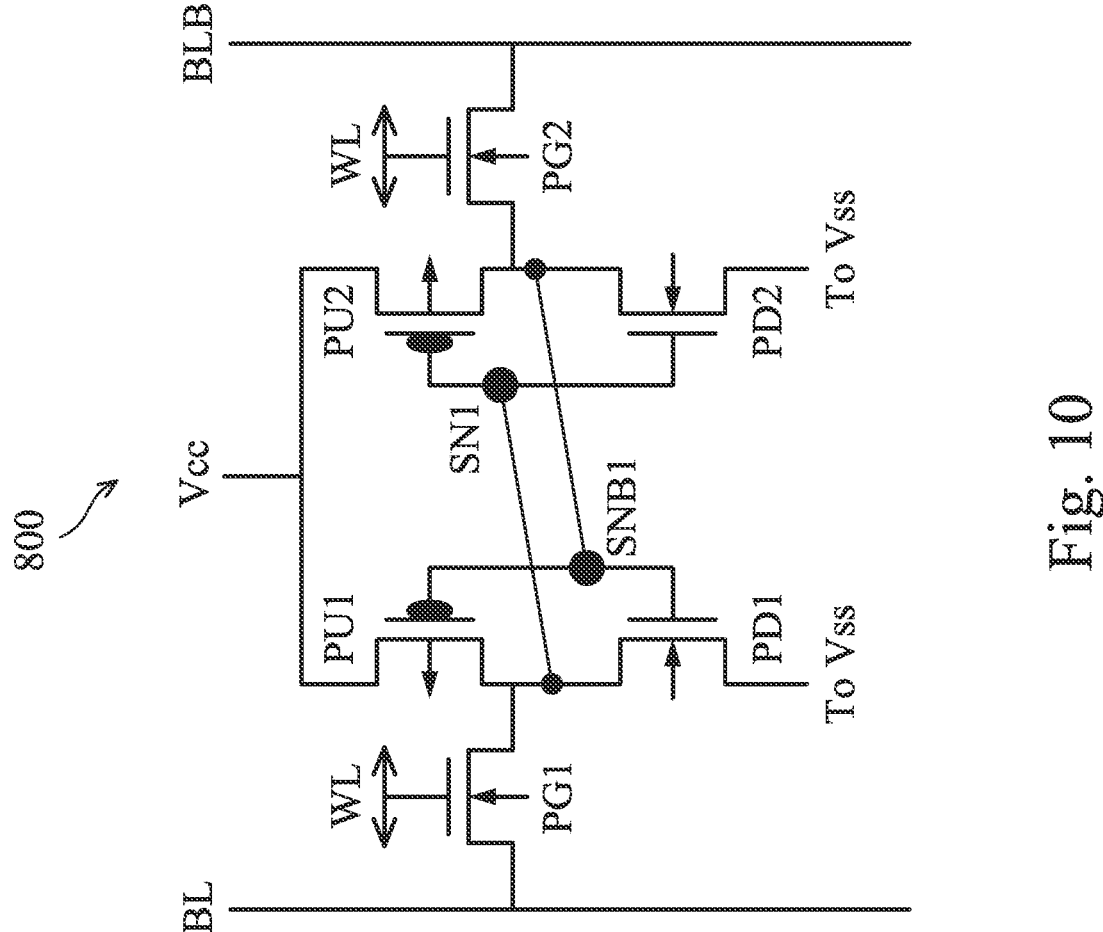
FIG. 10 illustrates a Static Random Access Memory (SRAM) cell according to various aspects of the present disclosure.
Figure 11:
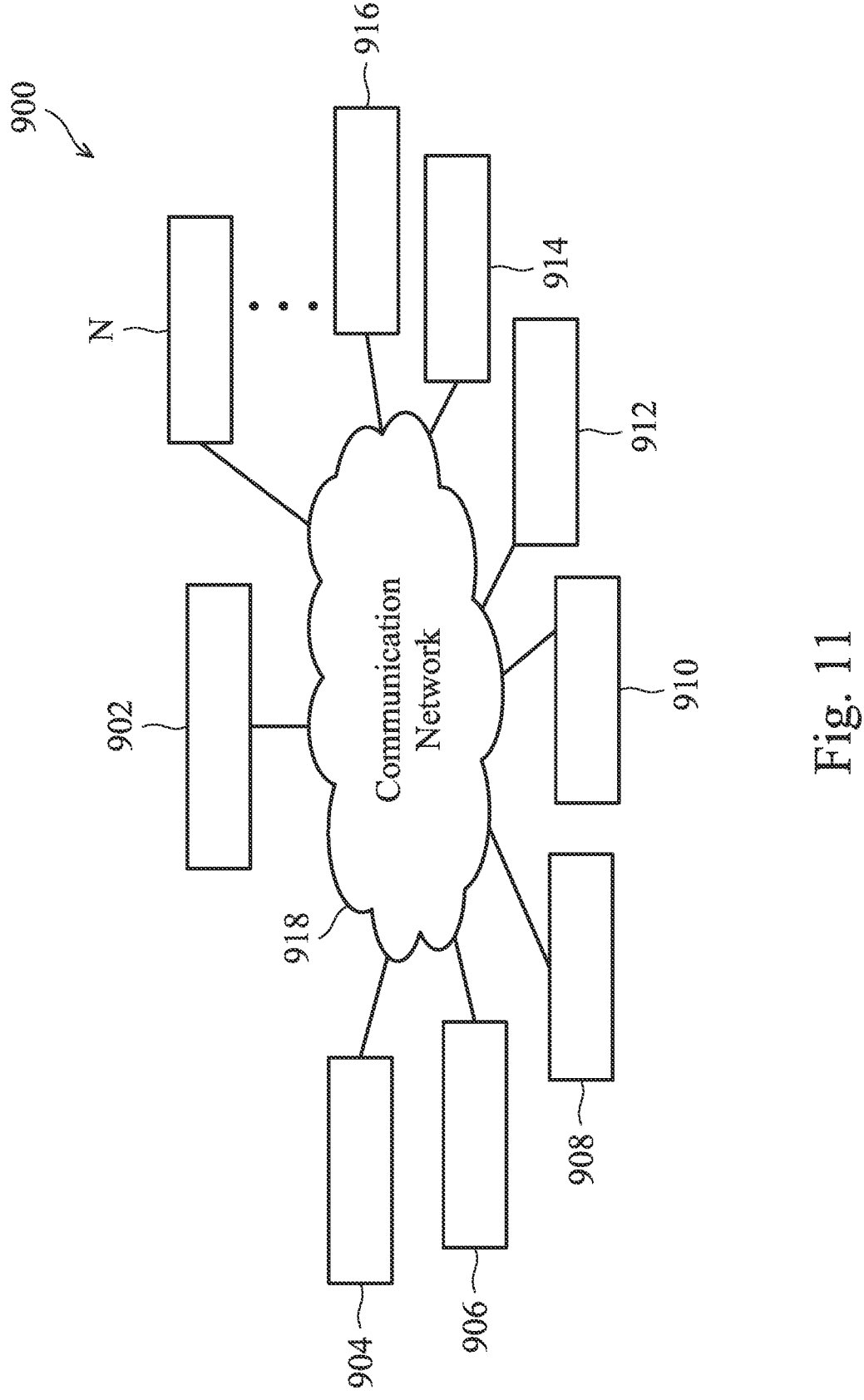
FIG. 11 illustrates an integrated circuit fabrication system according to various aspects of the present disclosure.

The various aspects of the present disclosure will now be discussed below with reference to FIGS. 1A-1C, 2A-9A, 2B-9B, and 10-12. In more detail, FIGS. 1A-B illustrate an example FinFET device, and FIG. 1C illustrates an example GAA device. FIGS. 2A-9A and 2B-9B illustrate cross-sectional side views of an IC device at various stages of fabrication according to embodiments of the present disclosure. FIG. 10 illustrates a memory circuit as an example IC application implemented using IC devices fabricated according to the various aspects of the present disclosure. FIG. 11 illustrates a semiconductor fabrication system. FIG. 12 illustrates a flowchart of a method of fabricating an IC device according to various aspects of the present disclosure.

Referring now to FIGS. 1A and 1B, a three-dimensional perspective view and a top view of a portion of an Integrated Circuit (IC) device 90 are illustrated, respectively. The IC device 90 is implemented using FinFETs. As shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 may include elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain components 122 formed over the fin structures 120. The source/drain components 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. In other words, the gate structures 140 each wrap around a plurality of fin structures 120. The gate structures 140 may be dummy gate structures (e.g., containing an oxide gate dielectric and a polysilicon gate electrode), or they may be High-k metal gate (HKMG) structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIGS. 1A-1B, multiple fin structures 120 are each oriented lengthwise along the X-direction, and multiple gate structure 140 are each oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 is disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each stack of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180. The ILD 185 may be referred to as an ILD0 layer. In some embodiments, the ILD 185 may include silicon oxide, silicon nitride, or a low-k dielectric material.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

FIGS. 2A-9A and 2B-9B illustrate diagrammatic fragmentary cross-sectional views of a portion of the IC device 200 at various stages of fabrication according to various embodiments of the present disclosure. In more detail, FIGS. 2A-9A illustrate the cross-sectional views along an X-Z plane, and as such, FIGS. 2A-9A may be referred to as X-cuts. For example, the cross-sectional side views of the IC device 200 in FIGS. 2A-9A may be obtained by taking a cross-sectional cut along the cutline A-A' shown in FIGS. 1B-1C. Meanwhile, FIGS. 2B-9B illustrate the cross-sectional views along a Y-Z plane, and as such, FIGS. 2B-9B may be referred to as Y-cuts. For example, the cross-sectional side views of the IC device 200 in FIGS. 2B-9B may be obtained by taking a cross-sectional cut along the cutline B-B' shown in FIGS. 1B-1C. For reasons of simplicity and consistency, similar components appearing in FIGS. 1A-1C will be labeled the same in FIGS. 2A-9A and 2B-9B. It is also understood that although the discussions below primarily use a GAA device (e.g., the GAA device of FIG. 1C) to illustrate the inventive concepts of the present disclosure, the same concepts may apply to FinFET devices (e.g., the FinFET device of FIGS. 1B-1C) as well, unless otherwise noted.

Figure 2A:
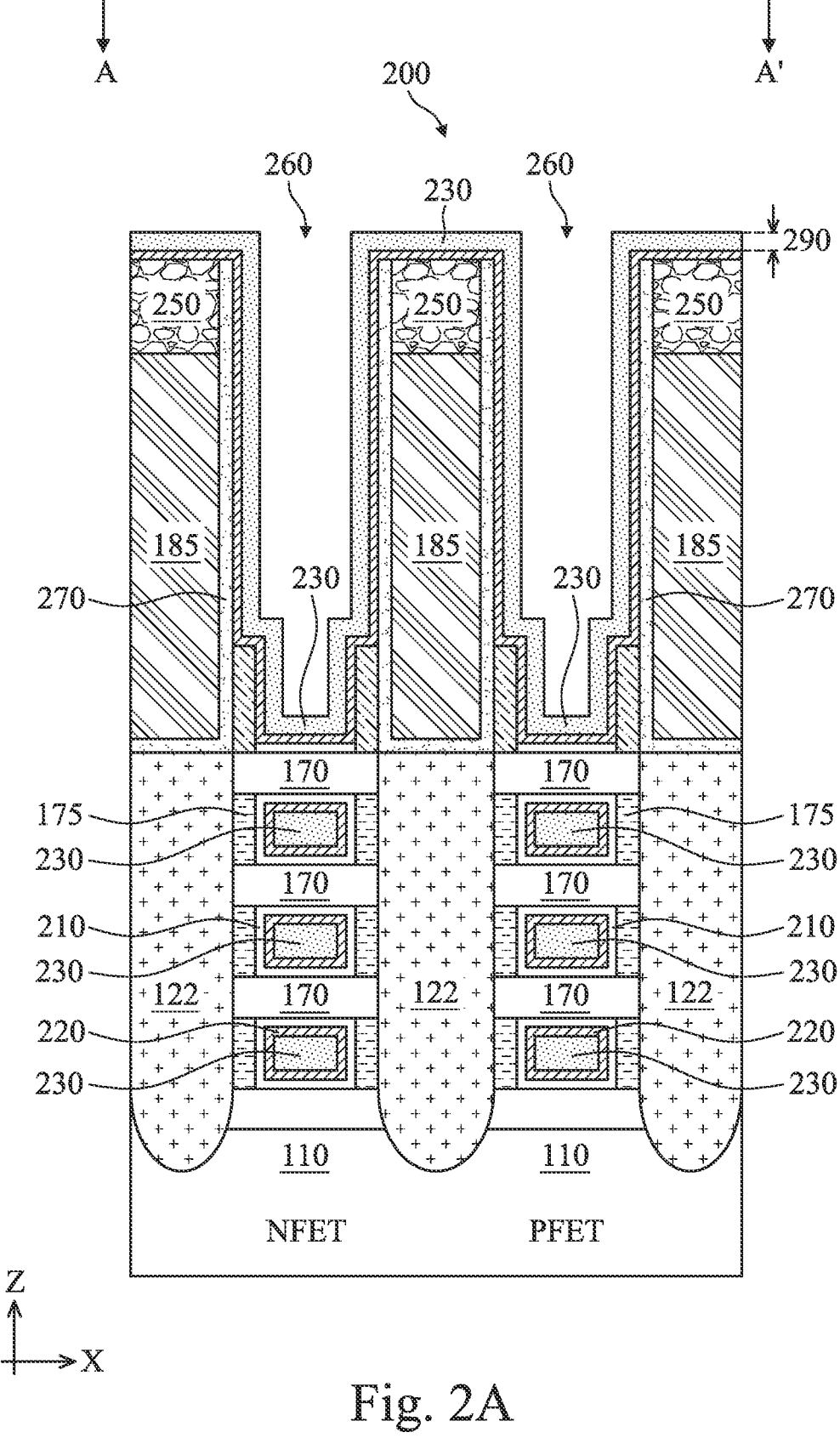
Figure 2B:
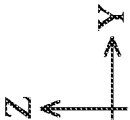

As shown in FIGS. 2A-2B, the IC device 200 includes an N-type transistor (NFET) and a P-type transistor (PFET). The NFET and PFET are formed on the same wafer, though they may be formed at different regions of the wafer and may or may not be physically contiguous to one another. The NFET and the PFET both include a substrate 110. As discussed above, the substrate 110 may comprise an elementary (single element) semiconductor, a compound semiconductor, an alloy semiconductor, and/or other suitable materials.

A plurality of nano-structures 170 are formed over the substrate 110 as a part of both the NFET and the PFET. As discussed above, the nano-structures 170 may include nano-sheets, nano-tubes, or nano-wires, or some other type of nano-structure that extends horizontally. Portions of the nano-structures 170 may serve as the channels of the NFET or PFET. The nano-structures 170 may be arranged into vertical stacks, e.g., disposed over one another vertically in the Z-direction. The nano-structures 170 contain semiconductor materials, such as Si or SiGe. In some embodiments, the nano-structures 170 of the NFET may contain different types of semiconductor materials than the nano-structures 170 of the PFET.

Each of the nano-structures 170 may also be wrapped around circumferentially by a gate structure. In more detail, the gate structure may include an interfacial layer 210 that is formed immediately adjacent to (e.g., in direct physical contact circumferentially) each of the nano-structures 170. In some embodiments, the interfacial layer 210 contains silicon oxide. The gate structure also includes gate dielectric layers 220 that are formed immediately adjacent to (e.g., in direct physical contact circumferentially) each of the interfacial layers 210. In other words, the interfacial layers 210 are located between the nano-structures 170 and the gate dielectric layers 220. In some embodiments, the gate dielectric layers 220 include a high-k dielectric material. The high-k dielectric material refers to a dielectric material having a dielectric constant that is greater than a dielectric constant of silicon oxide (e.g., which is about 3.9). Example materials of the high-gate k dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof.

At this stage of fabrication, the gate structure also includes a sacrificial layer 230 that are formed immediately adjacent to (e.g., in direct physical contact circumferentially) each of the gate dielectric layers 220. In other words, the gate dielectric layers 220 are located between the sacrificial layer 230 and the interfacial layers 210. The sacrificial layer 230 includes aluminum oxide in the illustrated embodiment, but may include other materials in alternative embodiments. It is understood that the sacrificial layer 230 will be removed in later processes and will be replaced by a metal-containing gate electrode layer, according to embodiments of the present disclosure. A material composition of the sacrificial layer 230 is configured to have a faster etching rate (or a faster removal rate) compared to a work function metal of the gate electrode, or compared to a gate dielectric layer of the gate structure. This allows the removal of the sacrificial layer 230 without inadvertently damaging the nano-structures 170, as discussed below in greater detail.

Source/drain components 122, which may be epitaxially grown over the substrate 110, are located between the vertical stacks of the nano-structures 170. Dielectric inner spacers 175 are formed between the vertical stacks of the nano-structures 170 and the source/drain components 122. In some embodiments, the dielectric inner spacers 175 each contain silicon nitride.

An interlayer dielectric (ILD) layer 185 is formed over the source/drain components 122. In some embodiments, the ILD layer 185 may include silicon oxide, which may be formed by a flowable chemical vapor deposition (FCVD) process. In other embodiments, the ILD layer 185 may include silicon nitride or a low-k dielectric material. The ILD layer 185 may be patterned by a patterned hard mask layer 250 (e.g., a silicon nitride hard mask layer) to define openings 260 that are aligned with (or located above) the stacks of nano-structures 170. As shown in FIG. 2B, the ILD layer 185 is also located between the stacks of the nano-structures 170 that are wrapped around circumferentially by the gate structures (e.g., gate structures including the interfacial layer 210, the gate dielectric layer 220, and the sacrificial layer 230).

In the illustrated embodiment, an etching stop layer 270 is also located between the ILD layer 185 and the source/drain components 122 and on the side surfaces of the ILD layer 185. In other words, the ILD layer 185 may be formed over the etching stop layer 270. In some embodiments, the etching stop layer 270 includes silicon nitride. And as shown in FIG. 2B, the etching stop layer 270 itself may be formed over the isolation structure 130 (e.g., an STI structure that contains silicon oxide).

As shown in FIG. 2A, portions of the gate dielectric layer 220 are also formed over the ILD layer 185, the etching stop layer 270, and over the patterned hard mask layer 250, and are partially disposed in the openings 260. Portions of the sacrificial layer 230 are also formed over the gate dielectric layer 220 to partially fill in the openings 260. The sacrificial layer 230 is formed to have a thickness 290. In some embodiments, the thickness 290 is in a range between about 30 angstroms and about 40 angstroms.

Figure 3A:
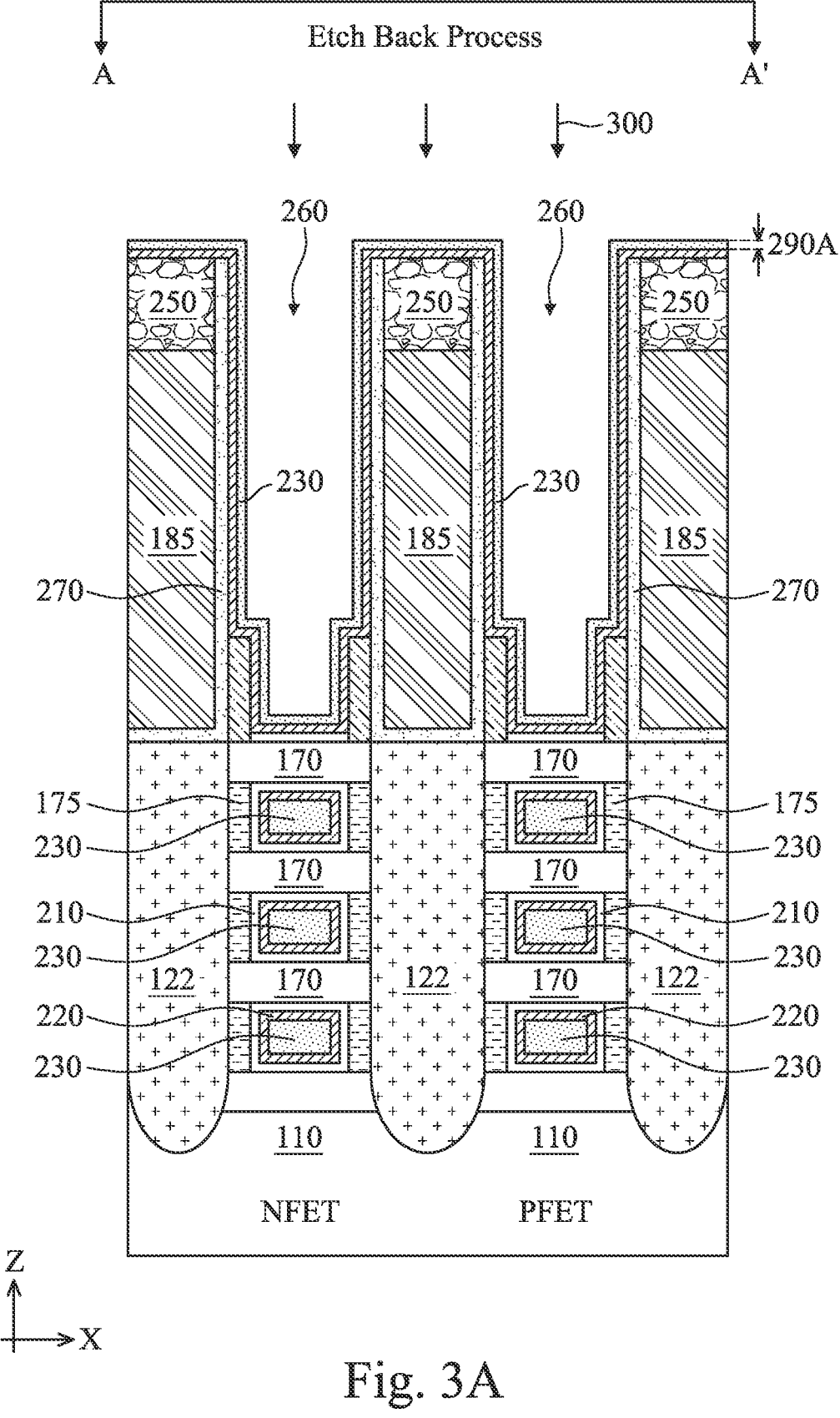
Figure 3B:
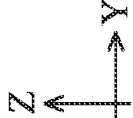

Referring now to FIGS. 3A-3B, an etch back process 300 is performed to the IC device 200. The etch back process 300 reduces the thickness 290 of the sacrificial layer 230 down to a thickness 290A. In some embodiments, the thickness 290A is in a range between about 200 angstroms and about 380 angstroms. The thinner sacrificial layer 230 makes their eventual removal (in a later fabrication process) easier.

Figure 4A:
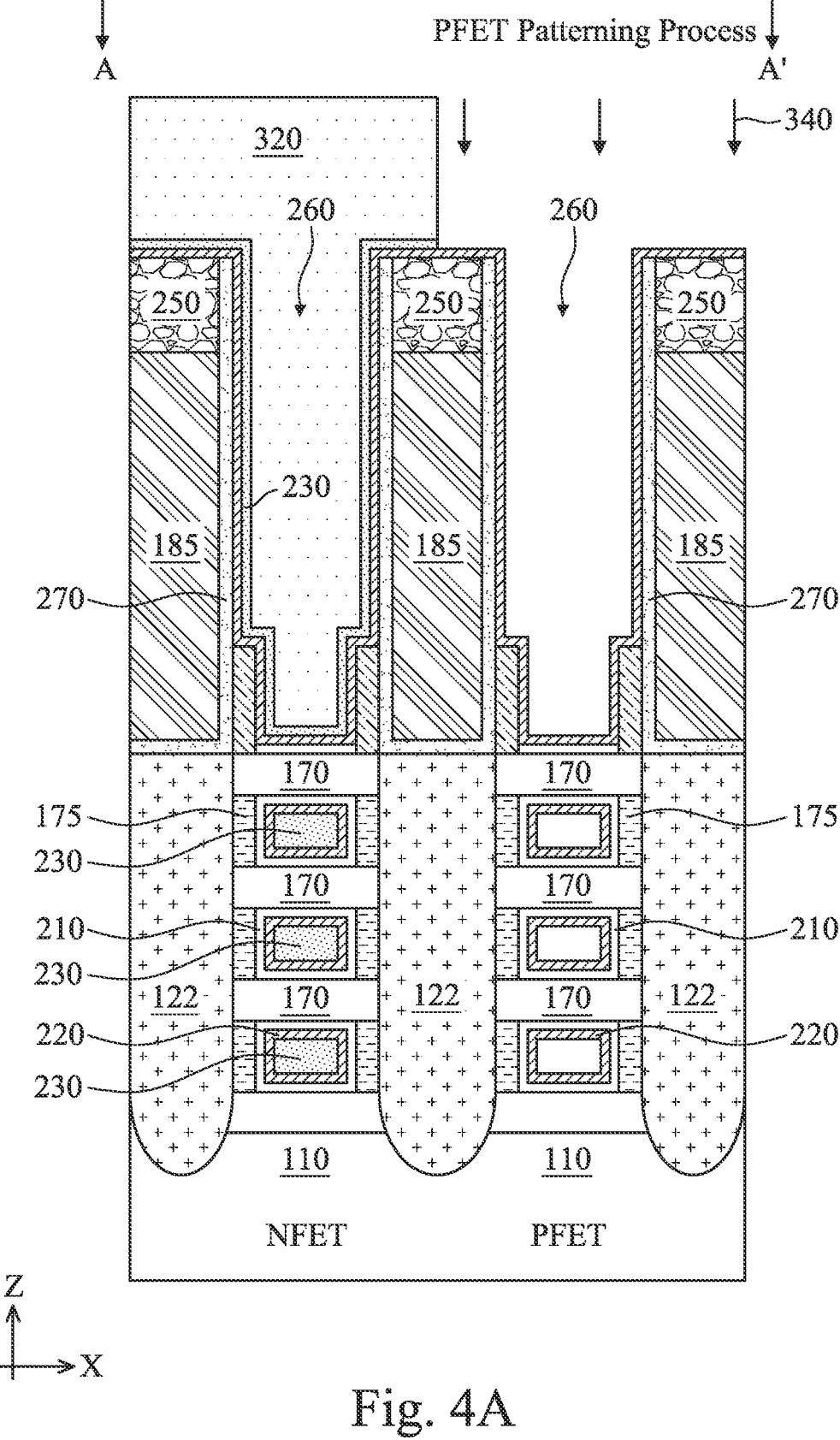
Figure 4B:
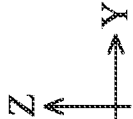

Referring now to FIGS. 4A-4B, a patterned photoresist layer 320 is formed over the NFET region of the IC device 200 but not over the PFET region of the IC device 200. The patterned photoresist layer 320 may be formed by spin coating a photoresist material over the IC device 200 (including both the NFET and the PFET regions), exposing either the NFET or the PFET regions (depending on whether a negative photoresist or a positive photoresist material is used), developing the photoresist, and performing one or more pre-exposure or post-exposure baking processes. In the illustrated embodiment, the remaining portions of the photoresist layer 320 covers the NFET region and fills the opening 260 that is disposed over the NFET region.

With the patterned photoresist layer 320 serving as a protective mask, a PFET patterning process 340 is performed to the IC device 200. The PFET patterning process 340 may include one or more etching processes to remove the portions of the sacrificial layer 230 located in the PFET region. For example, the portions of the sacrificial layer 230 exposed by the opening 260 in the PFET region are etched away. The sacrificial layer 230 and the gate dielectric layer 220 may have an etching selectivity during the etching processes, such that the sacrificial layer 230 may be etched away without substantially impacting the gate dielectric layer 220 of the PFET. For example, the sacrificial layer 230 may be etched away at a rate that is at least 10 times faster than the gate dielectric layer 220 during the etching processes. In this manner, the PFET patterning process 340 exposes the gate dielectric layer 220 of the PFET. The exposed gate dielectric layer 220 of the PFET is now ready for the formation of the P-type WF metal thereon. Since the material composition of the sacrificial layer 230 is configured so that it is easily removed (e.g., compared to the gate dielectric layer 220), the PFET patterning process 340 can be performed without causing damage to the structures of the PFET, such as to the gate dielectric layer 220 of the PFET or the nano-structures 170 circumferentially wrapped around by the gate dielectric layer 220.

Figure 5A:
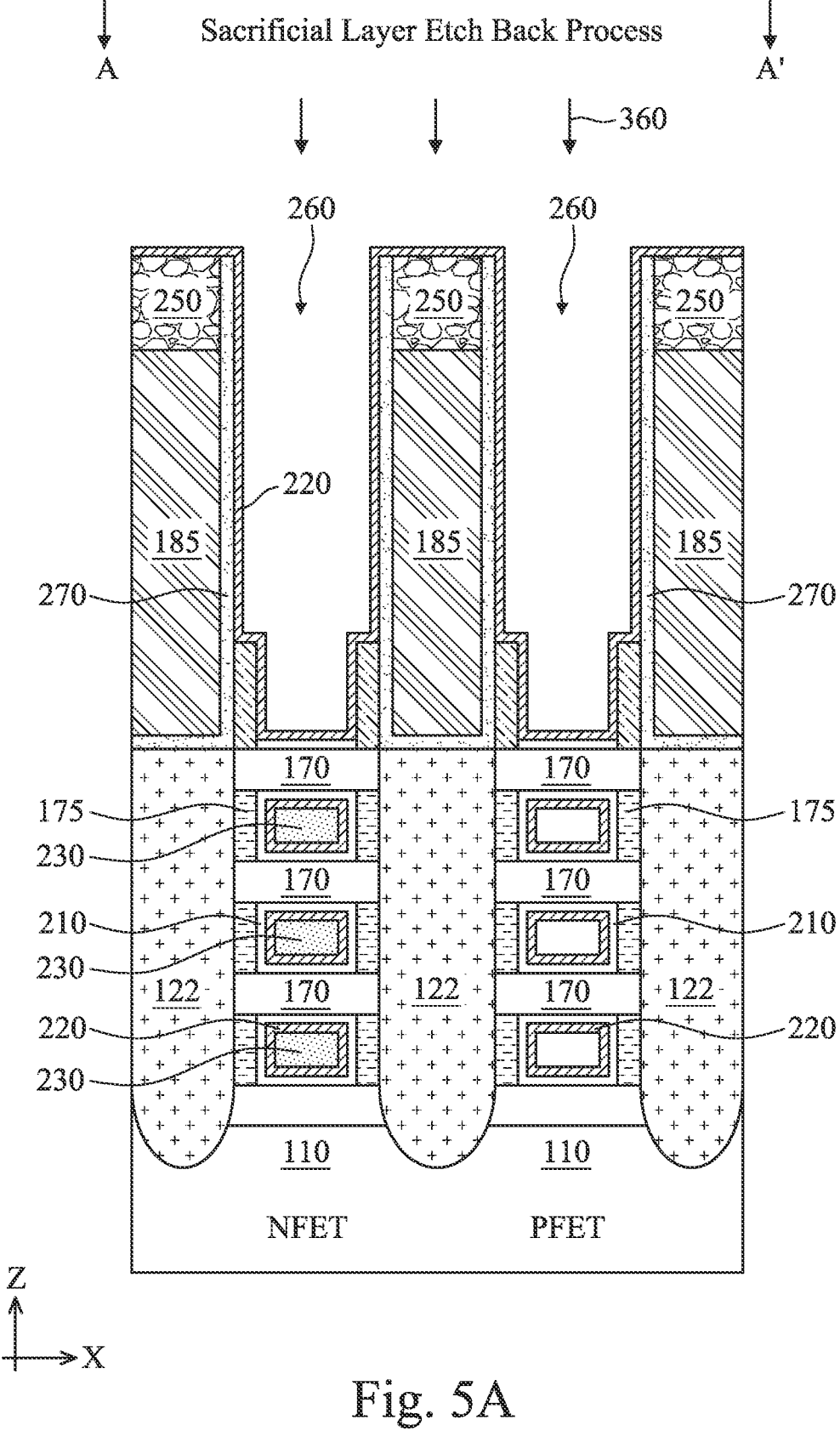
Figure 5B:
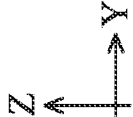

Referring now to FIGS. 5A-5B, the patterned photoresist layer 320 is removed, for example, using a photoresist stripping or photoresist ashing process. The removal of the photoresist layer 320 further exposes the NFET region of the IC device 200. Thereafter, a sacrificial layer etch back process 360 is performed to the IC device 200 to etch back the sacrificial layer 230. As a result of the sacrificial layer etch back process 360, portions of the sacrificial layer 230 filling the opening 260 in the NFET region are removed, but the portions of the sacrificial layer 230 still remain between the nano-structures 170 in the NET region, since they are protected by the nano-structures 170 (and the layers 210 and 220 surrounding the nano-structures 170) during the sacrificial layer etch back process 360.

Figure 6A:
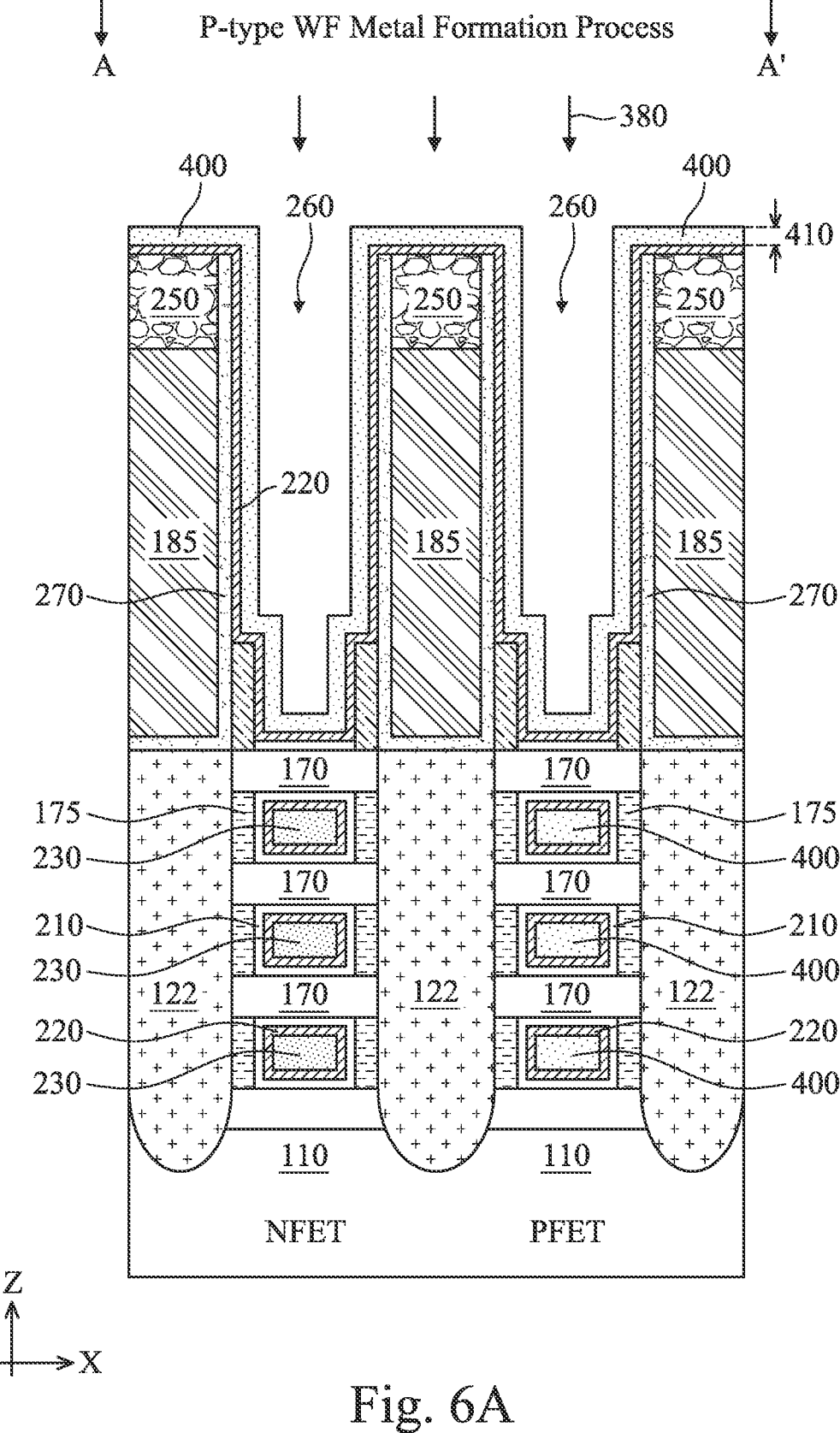
Figure 6B:
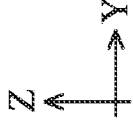

Referring now FIGS. 6A-6B, a P-type WF formation process 380 is performed to form a P-type WF metal layer 400. In some embodiments, the P-type WF formation process 380 includes a deposition process, such as an ALD process, to deposit the P-type WF metal layer 400 over the gate dielectric layer 220. In some embodiments, the P-type WF metal layer 400 may include TiN or have a TiN material composition. In some embodiments, the P-type WF metal layer 400 may have a thickness 410 that is in a range between about 30 angstroms and about 40 angstroms. Such a thickness range allows the P-type WF metal layer 400 to effectively tune the threshold voltage of the PFET device.

Since neither the NFET region nor the PFET region is covered by the sacrificial layer 230 (except in the spaces between the nano-structures 170 of the NFET), the P-type WF metal layer 400 is formed in both the NFET region and the PFET region at this stage of fabrication. In more detail, the P-type WF metal layer 400 is formed between the nano-structures 170, for example by circumferentially wrapping around the gate dielectric layer 220 in the PFET region. Alternatively stated, the P-type WF metal layer 400 effectively replaces the sacrificial layer 230 in the PFET region at this stage of fabrication.

However, the P-type WF metal layer 400 is not formed between the nano-structures 170 in the NFET region, since the sacrificial layer 230 still remain there. The presence of the sacrificial layer 230 in the NFET region is beneficial, because its removal is easier (in a later process) than the P-type WF metal layer 400. In other words, had the sacrificial layer 230 not been formed, the P-type WF metal layer 400 would have been formed in the NFET region as well, including between the nano-structures 170. But since the NFET needs an N-type WF metal for its gate electrode, any P-type WF metal layer formed in the NFET region would have to be removed in a later process, before the formation of an N-type WF metal in the NFET region. Unfortunately, the complete removal of the P-type WF metal between the nano-structures 170 in the NFET region could require strong chemicals, for example, abrasive etchants that could inadvertently damage other components of the IC device 200. Here, the sacrificial layer 230 plugs up the spaces between the nano-structures 170 in the NFET region and therefore prevents the formation of the P-type WF metal layer between the nano-structures 170 in the NFET region. As discussed above, the sacrificial layer 230 can be removed more easily (e.g., via a less abrasive etchant or chemical) than the P-type WF metal layer 400. Therefore, the process flow herein can avoid inadvertent damage from being done to the IC device 200, since no portions of the P-type WF metal layer needs to be removed between the nano-structures 170 in the NFET region.

Figure 7A:
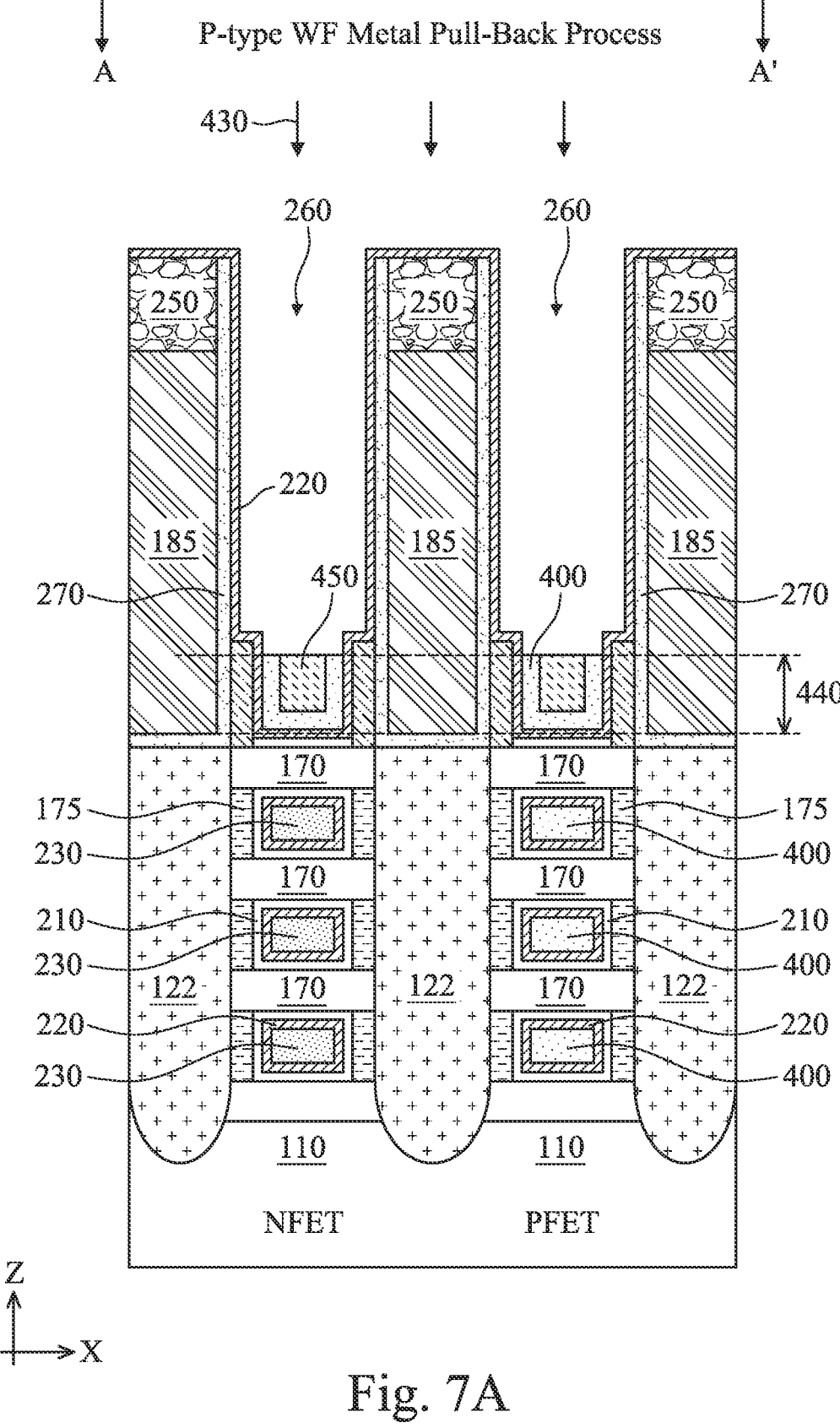
Figure 7B:
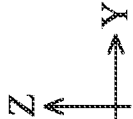

Referring now to FIGS. 7A-7B, a P-type WF metal pull-back process 430 is performed to the IC device 200 to partially remove the P-type WF metal layer 400. In some embodiments, the P-type WF metal pull-back process 430 includes one or more etching processes, such as an etch-back process. The portions of the P-type WF metal layer 400 disposed in the openings 260 are partially etched away, such that the remaining portions of the P-type WF metal layer 400 in the openings 260 have a height 440 after the P-type WF metal pull-back process has been performed. In some embodiments, the height 440 is in a range between about 9 nanometers (nm) and about 19 nm. Such a height range makes the eventual removal of the P-type WF metal layer 400 from the NFET region easier, since a substantial majority of the P-type WF metal layer 400 has already been removed by the P-type WF metal pull-back process 430.

Meanwhile, the portions of the P-type WF metal layer 400 that circumferentially surround the nano-structures 170 are substantially unaffected. Note that as a part of the P-type WF metal pull-back process 430, a layer 450 may first be formed over the P-type WF metal layer 400 in both the NFET region and the PFET region of the IC device 200. In some embodiments, the layer 450 contains a photoresist material. The layer 450 is etched away, along the P-type WF metal layer 400, as the P-type WF metal pull-back process is performed. The formation (and subsequent pull-back) of the layer 450 herein improves the process uniformity of the P-type WF metal pull-back process 430.

Figure 8A:
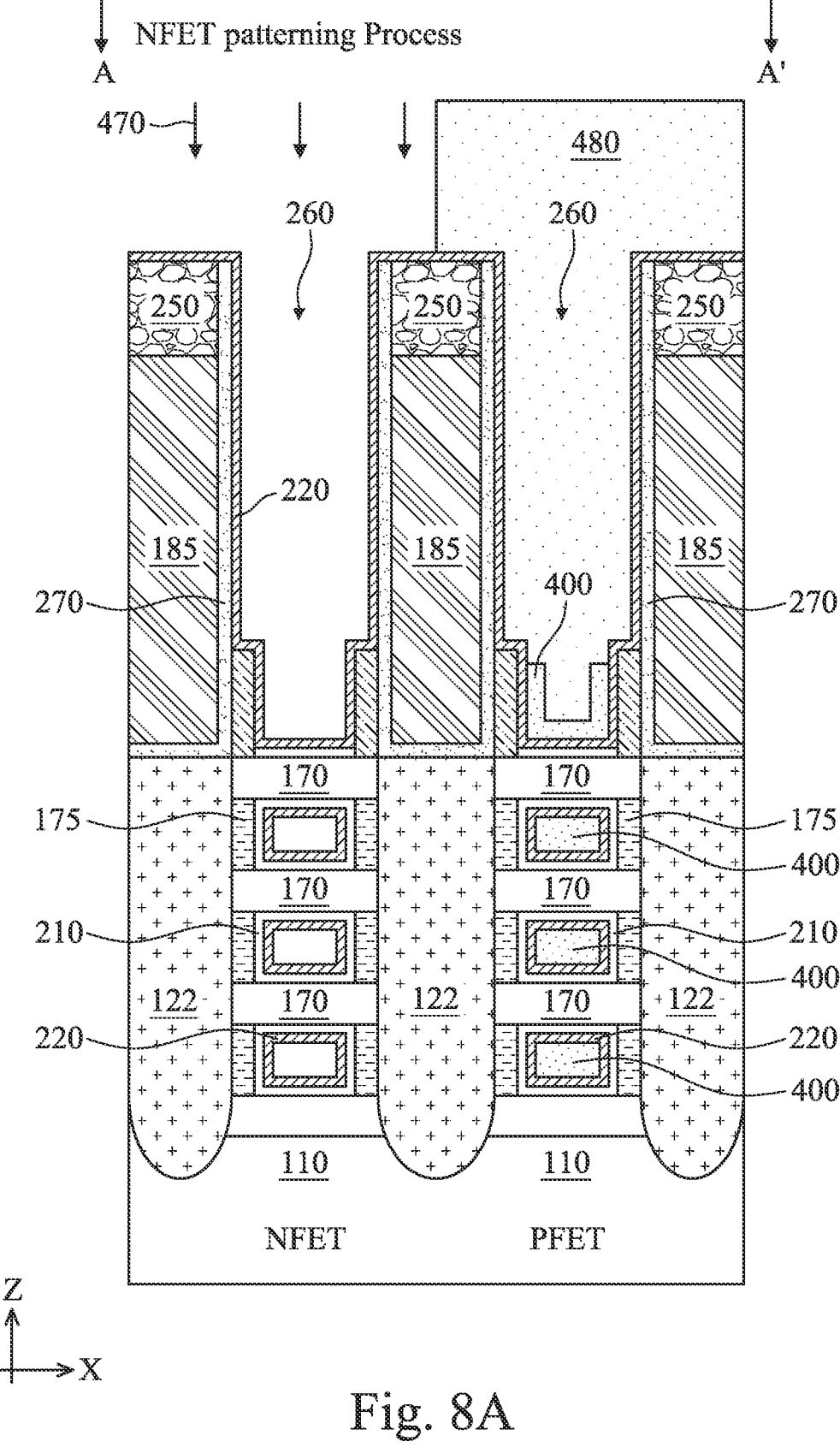
Figure 8B:
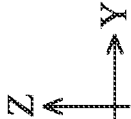

Referring now to FIGS. 8A-8B, an NFET patterning process 470 is performed to the IC device 200. In more detail, the NFET patterning process 470 may first remove the remaining portions of the layer 450 in both the NFET and PFET regions. The NFET patterning process 470 then forms a patterned photoresist layer 480 over the PFET region, but not the NFET region, of the IC device 200. The patterned photoresist layer 480 fills the opening 260 in the PFET region and covers up the P-type WF metal layer 400, while leaving the opening 260 in the NFET region exposed. Next, the NFET patterning process 470 performs one or more etching processes to substantially remove the remaining portions of the P-type WF metal layer 400. The patterned photoresist layer 480 serves as a protective mask for the P-type WF metal layer 400 in the PFET region. As a result, the NFET patterning process 470 exposes the gate dielectric layers 220 in the NFET region, while the P-type WF metal layers 400 in the PFET region are protected and substantially unaffected by the NFET patterning process 470.

Figure 9A:
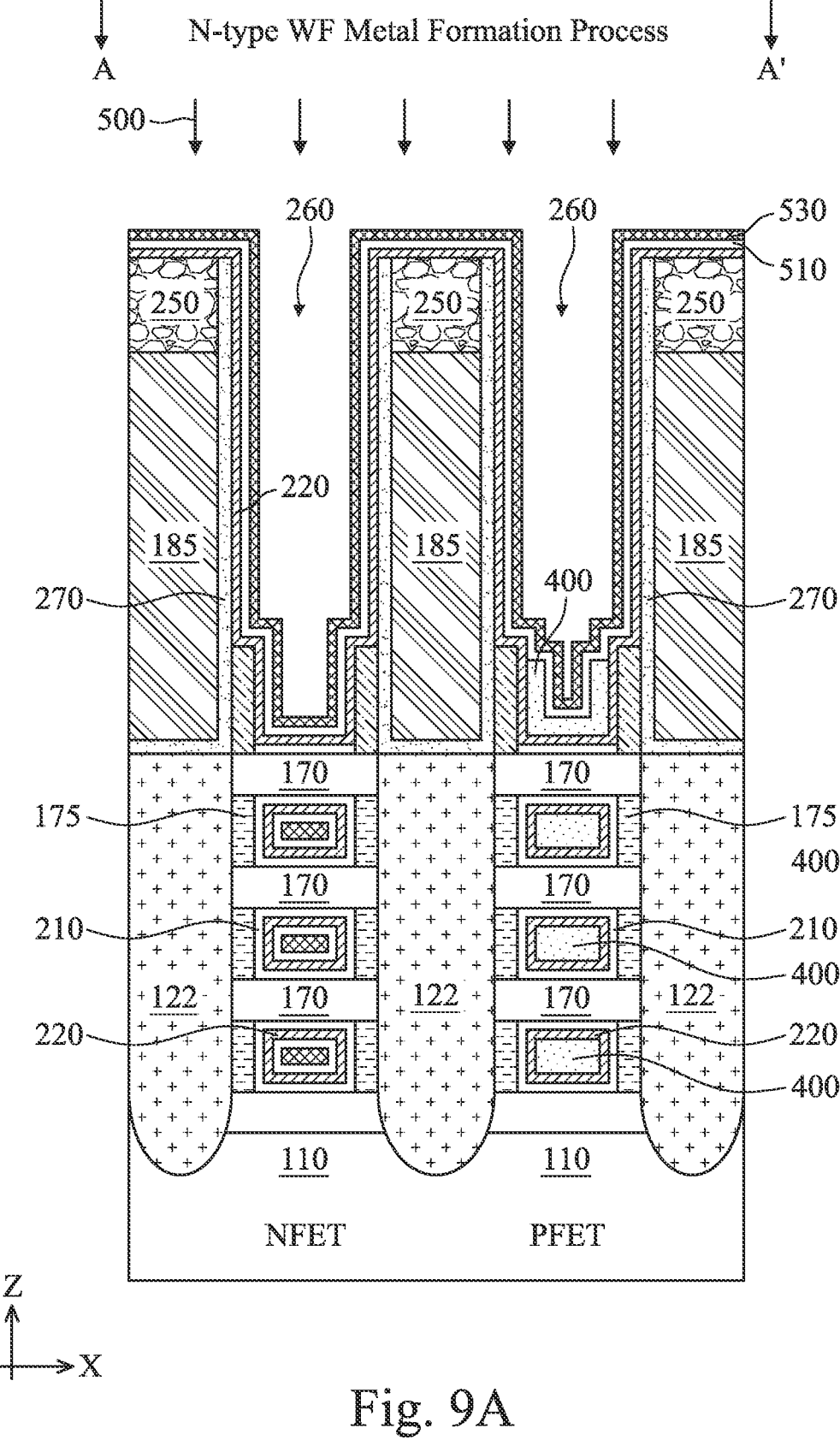
Figure 9B:
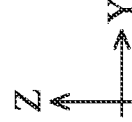

Referring now to FIGS. 9A-9B, an N-type WF metal formation process 500 is performed to the IC device 200. As a first step of the N-type WF metal formation process 500, the patterned photoresist layer 480 is removed. The removal of the patterned photoresist layer 480 may involve the application of an oxygen-containing chemical. As such, the P-type WF metal layer 400 may become partially oxidized. Although the oxidation of the P-type WF metal layer 400 is not intentional or desirable, it is not a major concern herein. One reason is that the PFET devices herein are used to implement the pull-up (PU) transistors of Static Random Access Memory (SRAM) cells (discussed in more detail below with reference to FIG. 10). Compared to pull-down (PD) transistors or pass-gate (PG) transistors of the SRAM cells—which are implemented using NFET devices—the PU transistors are less sensitive to any performance degradation caused by the unintentional oxidation of its WF metal. In other words, the N-type WF metals of the PD and PG transistors of the SRAM cells have greater sensitivity to material degradations or impurities compared to the P-type WF metals of the PU transistors of the SRAM cells. As such, it is more preferable to expose the P-type WF metal layer 400 of the PFET to the unintentional oxidation caused by the removal of the patterned photoresist layer 480, as opposed to exposing the N-type WF metal layer (of the NFET). In contrast, conventional semiconductor device fabrication process flows may expose an N-type WF metal layer of the NFET to unintentional oxidation (e.g., caused by the removal of a photoresist material from the NFET region). Therefore, devices (e.g., SRAM cells) formed by the conventional fabrication process flow may have worse device performance compared to the devices of the present disclosure, for example performance degradations associated with high fluctuations of threshold voltage. The devices formed of the present disclosure can achieve better threshold voltage uniformity and/or device speed compared to conventional devices.

As a second step of the N-type WF metal formation process, a deposition process is performed to deposit an N-type WF metal layer 510 on the P-type WF metal layer 400. In some embodiments, the N-type WF metal layer 510 includes an aluminum-containing material, for example, titanium aluminum carbide (TiAlC). In some embodiments, the deposition process may include an ALD process to finely control a thickness 520 of the N-type WF metal layer 510. In some embodiments, the thickness 520 is in a range between about 30 angstroms and about 40 angstroms. Such a thickness range allows the N-type WF metal layer 510 to effectively tune the threshold voltage of the NFET device.

Note that although the PFET region now has presence of an N-type WF metal (e.g., the TiAlC of the N-type WF metal layer 510), it does not substantially affect the performance or intended operation of the PFET device. One reason is that the N-type WF metal layer 510 does not circumferentially surround the nano-structures 170 in the PFET region (see FIG. 9B). For example, the spaces between the nano-structures 170 (serving as channels of the PFET device) are filled by the interfacial layer 210, the gate dielectric layer 220, and the P-type WF metal layer 400. No portions of the N-type WF metal layer 510 are disposed in these spaces between the nano-structures 170 in the PFET region. Rather, one segment 510A of the N-type WF metal layer 510 is disposed over an uppermost one of the nano-structures 170, but even that segment 510A is still located above the P-type WF metal layer 400. Since the P-type WF metal layer 400 is closer to the uppermost one of the nano-structures 170, it exerts more influence on the threshold voltage tuning of the PFET device than the N-type WF metal layer 510 that is located farther away.

Furthermore, to the extent that the segment 510A of the N-type WF metal layer 510 exerts any amount of influence on the threshold voltage tuning of the PFET device, it is still mostly exerted to just the uppermost one of the nano-structures 170. The presence of the segment 510A N-type WF metal layer 510 has little impact to the rest of the nano-structures 170 below the uppermost nano-structure 170, since the segment 510A of the N-type WF metal layer 510 is located even farther away from the rest of the nano-structures 170. In addition, as shown in FIG. 9B, the N-type WF metal layer 510 has downwardly protruding vertical segments 510B, but these downwardly protruding segments 510B do not circumferentially surround the nano-structures 170 either, as they are located on the "sides" of the nano-structures 170 in the PFET region. Again, such a disposition limits the amount of influence of the N-type WF metal layer 510 on the threshold voltage tuning of the PFET device.

As a third step of the N-type WF metal formation process, a deposition process is performed to deposit a layer 530 on the N-type WF metal layer 510. In some embodiments, the layer 530 may include TiN. The layer 530 prevents the N-type WF metal layer 510 from being oxidized, which would have been undesirable. In some embodiments, the deposition process may include an ALD process to finely control a thickness 540 of the layer 530. In some embodiments, the thickness 410 or the thickness 520 is at least twice as great as the thickness 540. For example, in embodiments where the thickness 410 or the thickness 520 is in a range between about 30 angstroms and about angstroms, the thickness 540 may be in a range between about 10 angstroms and about 12 angstroms. Such a thickness range allows the layer 530 to be sufficiently thick to effectively protect the N-type WF metal layer 510 from being oxidized, and yet not too thick to cause undesirable interference with the tuning of the work function of the NFET device. In other words, even though the layer 530 may contain a P-type WF metal such as TiN, its disposition in the NFET region still does not substantially interfere with the threshold voltage tuning of the NFET device, because the layer 530 is much thinner compared to the N-type WF metal layer 510, and also because the layer 530 is located farther away from the nano-structures 170 (serving as channels of the NFET) compared to the N-type WF metal layer 510.

It is understood that additional fabrication processes may be performed to complete the fabrication of the IC device 200. For example, fill metals—serving as the main conductive portion of the gate electrode—may be deposited over the layer 530 in both the NFET region and the PFET region. In some embodiments, the fill metal layer may include cobalt, tungsten, copper, aluminum, or alloys or combinations thereof. Conductive contacts, such as gate contacts and/or source/drain contacts, may also be formed to provide electrical connectivity to the components of the NFET and PFET devices. Thereafter, a multi-layer interconnect structure may also be formed. The interconnect structure may include metal lines and vias to carry out electrical routing. For reasons of simplicity, however, these additional processes and components are not specifically illustrated herein.

Due to the unique fabrication process flow performed herein, the IC device 200 herein has certain unique physical characteristics as well. One unique physical characteristic is that the PFET device herein contains traces of N-metal. For example, the TiAlC material of the N-type WF metal layer 510 are present in the PFET device. Specifically, a segment 510A of the N-type WF metal layer 510 is located above the uppermost surface of the P-type WF metal layer 400. In addition, segments 510B of the N-type WF metal layer 510 protrude downwardly toward the substrate 110 in the PFET, and these segments 510B are located on the side surfaces of the P-type WF metal layer 400. However, no portion of the N-type metal layer 510 is located in the spaces between the nano-structures 170 of the PFET. Furthermore, a TiN-containing layer 530 is also formed on the upper surface of the N-type WF metal layer 510 in both the NFET and the PFET. Portions of this TiN-containing layer 530 are also formed in the spaces between the nano-structures 170 of the NFET, but not between the nano-structures 170 of the PFET. These unique physical traits can be detected using electron microscope scans, and their presence in IC devices may serve as evidence that the IC devices were fabricated using the methods of the present disclosure.

It is understood that the IC device 200 discussed above may be implemented in a variety of IC applications, including memory devices such as Static Random-Access Memory (SRAM) devices. In that regard, FIG. 10 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

As discussed above, NFET devices are used to implement the PD and PG transistors, and PFET devices are used to implement the PU transistors. Since the PD and PG transistors are more sensitive to potential degradations than PU transistors, it is more preferable to avoid potential damage to the NFET devices. Accordingly, the present disclosure utilizes a fabrication process flow to prevent the potential damage to the NFET devices caused by oxidation. Therefore, the SRAM device performance may be improved.

FIG. 11 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such the processing tools to perform the various deposition processes discussed above; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 12 is a flowchart illustrating a method 1000 of fabricating a semiconductor device. The method 1000 includes a step 1010 to form a sacrificial layer over a first channel structure of an NFET and over a second channel structure of a PFET.

The method 1000 includes a step 1020 to perform a PFET patterning process at least in part by etching away the sacrificial layer in the PFET while protecting the NFET from being etched.

The method 1000 includes a step 1030 to deposit a P-type work function (WF) metal layer in both the NFET and the PFET.

The method 1000 includes a step 1040 to perform an NFET patterning process at least in part by etching away the P-type WF metal layer and the sacrificial layer in the NFET while protecting the PFET from being etched.

The method 1000 includes a step 1050 to deposit an N-type WF metal in both the NFET and the PFET.

In some embodiments, the first channel structure includes a first stack of nano-structures, the second channel structure includes a second stack of nano-structures, and the step 1010 of forming the sacrificial layer comprises depositing the sacrificial layer circumferentially around each of the nano-structures. In some embodiments, the depositing the P-type WF metal layer includes filling spaces between the second stack of nano-structures with the P-type WF metal layer without filling spaces between the first stack of nano-structures with the P-type WF metal layer. In some embodiments, the depositing the N-type WF metal layer includes filling spaces between the first stack of nano-structures with the N-type WF metal layer without filling spaces between the second stack of nano-structures with the N-type WF metal layer.

In some embodiments, the step 1020 of performing the PFET patterning process includes forming a photoresist layer as a protective layer for the NFET but not for the PFET. In some embodiments, after the performing PFET patterning process but before the depositing the P-type WF metal layer, the photoresist layer is removed, and the sacrificial layer is etched back.

In some embodiments, the step 1030 of depositing the P-type WF metal layer comprises depositing a TiN layer as the P-type WF metal layer. In some embodiments, the step 1050 of depositing the N-type WF metal layer comprises depositing a TiAlC layer as the N-type WF metal layer. In some embodiments, a further TiN layer is deposited over the TiAlC layer in both the NFET and the PFET.

It is understood that additional steps may be performed before, during, or after the steps 1010-1050. For example, in some embodiments, the method 1000 may further include a step of etching back the sacrificial layer before the PFET patterning process is performed according to the step 1020. In some embodiments, the etching back includes forming a photoresist layer over the P-type WF metal layer in both the NFET and the PFET, and etching back the photoresist layer along with the P-type WF metal layer in both the NFET and the PFET. In some embodiments, the method 1000 may further include a step of etching back the P-type WF metal layer in both the NFET and the PFET, which may be performed after the depositing the P-type WF metal layer but before the NFET patterning process has been performed.

The unique fabrication process flow and the resulting IC device structure of the present disclosure offers advantages over conventional devices. It is understood, however, that no particular advantage is required, other embodiments may offer different advantages, and that not all advantages are necessarily disclosed herein. One advantage is the improved device performance, particularly with respect to SRAM devices. For example, as device sizes are scaled down in newer technology generations, the microelectronic components of an IC may be more prone to inadvertent damage. Such an inadvertent damage may occur when photoresist material (used for patterning) is removed, which may require an application of chemicals that oxidize the WF layers underneath the photoresist material. The oxidation of N-type WF metals is particularly troublesome, since the NFETs are used to implement the PG and PD transistors of SRAM devices, where the PG and PD transistors are more sensitive to performance degradations than the PU transistors implemented by PFETs. The unique process flow of the present disclosure avoids such a photoresist removal process that could oxidize (and thus damage) the N-type WF metals of the NFET. As such, the resulting SRAM may have better device performance with respect to threshold voltage (e.g., a more uniform threshold voltage) and/or speed (e.g., a faster speed). Other advantages may include ease of fabrication and compatibility with existing fabrication processes.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure pertains to a semiconductor device. The semiconductor device includes a substrate. A channel structure protrudes vertically out of the substrate. A gate dielectric layer is disposed over the channel structure. A P-type work function (WF) metal layer is disposed over the gate dielectric layer. An N-type WF metal layer is disposed over the P-type WF metal layer.

Another aspect of the present disclosure pertains to a semiconductor device. The semiconductor device includes an N-type transistor (NFET). The NFET includes: a first stack of nano-structures that are disposed over one another; a first gate dielectric structure that circumferentially surrounds each of the nano-structures in the first stack in a cross-sectional view; and an N-type work function (WF) metal layer that circumferentially surrounds the first gate dielectric structure in the cross-sectional view. The semiconductor device includes a P-type transistor (PFET). The PFET includes: a second stack of nano-structures that are disposed over one another; a second gate dielectric structure that circumferentially surrounds each of the nano-structures in the second stack in the cross-sectional view; a P-type WF metal layer that circumferentially surrounds the second gate dielectric structure in the cross-sectional view; and portions of the N-type WF metal layer disposed over an upper surface and side surfaces of the P-type WF metal layer in the cross-sectional view.

Yet another aspect of the present disclosure pertains to a method of fabricating a semiconductor device. A sacrificial layer is formed over a first channel structure of an N-type transistor (NFET) and over a second channel structure of a P-type transistor (PFET). A PFET patterning process is performed at least in part by etching away the sacrificial layer in the PFET while protecting the NFET from being etched. After the PFET patterning process has been performed, a P-type work function (WF) metal layer is deposited in both the NFET and the PFET. An NFET patterning process is performed at least in part by etching away the P-type WF metal layer and the sacrificial layer in the NFET while protecting the PFET from being etched. After the NFET patterning process has been performed, an N-type WF metal layer is deposited in both the NFET and the PFET.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a substrate;
a channel structure that protrudes vertically out of the substrate;
a gate dielectric layer disposed over the channel structure;
a P-type work function (WF) metal layer disposed over the gate dielectric layer, wherein the P-type WF metal layer is part of a gate electrode of a PFET device;
a first N-type WF metal layer disposed over the P-type WF metal layer, wherein the first N-type WF metal layer is another part of the gate electrode of the PFET device, and wherein the first N-type WF metal layer includes downwardly protruding segments in a cross-sectional view;
an NFET device that includes a second N-type WF metal layer, wherein the first N-type WF metal layer and the second N-type WF metal layer include a same type of WF metal material; and
a dielectric structure that protrudes vertically out of the substrate and that is disposed between the PFET device and the NFET device.

2. The semiconductor device of claim 1, wherein the gate electrode extends in a first horizontal direction, and wherein the cross-sectional view is defined by the first horizontal direction and a vertical direction.

3. The semiconductor device of claim 1, wherein:
the channel structure includes a stack of nano-structures that are disposed over one another;
the gate dielectric layer circumferentially surrounds each of the nano-structures in a cross-sectional view; and
the P-type WF metal layer circumferentially surrounds the gate dielectric layer in the cross-sectional view.

4. The semiconductor device of claim 3, wherein no portion of the first N-type WF metal layer is disposed between the nano-structures of the PFET device in the cross-sectional view.

5. The semiconductor device of claim 1, wherein:
the P-type WF metal layer contains TiN;
the first N-type WF metal layer contains TiAlC; and
the semiconductor device further includes a TiN-containing layer that is formed over the first N-type WF metal layer.

6. The semiconductor device of claim 5, wherein:
the P-type WF metal layer or the first N-type WF metal layer has a first thickness;
the TiN-containing layer has a second thickness; and
the first thickness is at least twice the second thickness.

7. The semiconductor device of claim 5, wherein the TiN-containing layer is further disposed over the second N-type WF metal layer.

8. The semiconductor device of claim 7, wherein an upper surface of the TiN-containing layer of the PFET device is more elevated vertically than the second N-type WF metal layer of the NFET device.

9. A semiconductor device, comprising:

an N-type transistor (NFET) that includes:

a first stack of nano-structures that are disposed over one another;

a first gate dielectric structure that circumferentially surrounds each of the nano-structures in the first stack in a cross-sectional view; and an N-type work function (WF) metal layer that circumferentially surrounds the first gate dielectric structure in the cross-sectional view; and a P-type transistor (PFET) that includes:

a second stack of nano-structures that are disposed over one another;

a second gate dielectric structure that circumferentially surrounds each of the nano-structures in the second stack in the cross-sectional view;

a P-type WF metal layer that circumferentially surrounds the second gate dielectric structure in the cross-sectional view;

portions of the N-type WF metal layer disposed over an upper surface and side surfaces of the P-type WF metal layer in the cross-sectional view;

a first portion of a protective layer disposed over the portions of the N-type WF metal layer in the PFET, wherein a thickness of the N-type WF metal layer is at least twice as thick as the first portion of the protective layer; and a second portion of the protective layer is disposed over the N-type WF metal layer in the NFET.

10. The semiconductor device of claim 9, wherein spaces between the nano-structures in the second stack are filled by portions of the P-type WF metal layer, but not by the portions of the N-type WF metal layer.

11. The semiconductor device of claim 9, further comprising a TiN material that is located in both the NFET and the PFET, wherein:

portions of the TiN material in the NFET are located between the nano-structures in the first stack; and portions of the TiN material in the PFET are located over, but not between, the nano-structures in the second stack.

12. The semiconductor device of claim 9, wherein no portion of the P-type WF metal layer is disposed over an upper surface or side surfaces of the N-type WF metal layer in the cross-sectional view.

13. The semiconductor device of claim 9, wherein in the PFET, a bottommost surface of the portions of the N-type WF metal layer has a lower vertical elevation than a bottom surface of a bottommost one of the nano-structures in the second stack of nano-structures.

14. The semiconductor device of claim 9, wherein the protective layer contains a material that prevents the N-type WF metal layer from being oxidized.

15. The semiconductor device of claim 9, wherein the protective layer contains TiN.

16. A semiconductor device, comprising:

a first stack of first nano-structure channels of a P-type transistor (PFET), wherein the first nano-structure channels are disposed over one another in a vertical direction in a cross-sectional side view;

a first gate dielectric layer of the PFET, wherein the first gate dielectric layer surrounds each of the first nano-structure channels in the first stack in the cross-sectional side view;

a P-type work function (WF) metal layer of the PFET, wherein the P-type WF metal layer surrounds the first gate dielectric layer in the cross-sectional side view;

a second stack of second nano-structure channels of an N-type transistor (NFET), wherein the second nano-structure channels are disposed over one another in the vertical direction in a cross-sectional side view;

a second gate dielectric layer of the NFET, wherein the second gate dielectric layer surrounds each of the second nano-structure channels in the second stack in the cross-sectional side view;

a first N-type WF metal layer of the PFET disposed over the P-type WF metal layer, wherein a segment of the first N-type WF metal layer of the PFET protrudes downwardly beyond a bottommost one of the first nano-structure channels in the cross-sectional side view;

a second N-type WF metal layer of the NFET that surrounds each of the second gate dielectric layers in the cross-sectional side view, wherein the first N-type WF metal layer and the second N-type WF metal layer have a same material composition; and an isolation structure disposed between the PFET and the NFET, wherein a topmost surface of the isolation structure is more elevated vertically than a bottommost surface of the first stack of first nano-structure channels or a bottommost surface of the second stack of second nano-structure channels.

17. The semiconductor device of claim 16, wherein the cross-sectional side view is defined by the vertical direction and a first horizontal direction, and wherein each of the first nano-structure channels extends in a second horizontal direction different from the first horizontal direction.

18. The semiconductor device of claim 17, wherein the cross-sectional side view is a first cross-sectional side view, and wherein a bottommost surface of the first N-type WF metal layer of the PFET is disposed above a top surface of a topmost one of the first nano-structure channels in a second cross-sectional side view defined by the vertical direction and the second horizontal direction.

19. The semiconductor device of claim 16, further comprising a protective layer disposed over at least the first N-type WF metal layer, wherein the protective layer contains TiN, and wherein the N-type WF metal layer is at least twice as thick as the protective layer.

20. The semiconductor device of claim 16, wherein an uppermost surface of the second N-type WF metal layer has a lower vertical elevation than an uppermost surface of the first N-type WF metal layer in the cross-sectional side view.

* * * * *